United States Patent
Barre

(10) Patent No.: US 7,587,192 B2
(45) Date of Patent: Sep. 8, 2009

(54) BALANCED MIXER WITH CALIBRATION OF LOAD IMPEDANCES

(75) Inventor: Philippe Barre, Le Fresne Camilly (FR)

(73) Assignee: ST-Ericsson SA, Geneva (CH)

( * ) Notice: Subject to any disclaimer, the term of this patent is extended or adjusted under 35 U.S.C. 154(b) by 477 days.

(21) Appl. No.: 11/579,884

(22) PCT Filed: May 4, 2005

(86) PCT No.: PCT/IB2005/051471

§ 371 (c)(1),
(2), (4) Date: Nov. 10, 2006

(87) PCT Pub. No.: WO02/084859

PCT Pub. Date: Oct. 24, 2002

(65) Prior Publication Data

US 2008/0139164 A1    Jun. 12, 2008

(30) Foreign Application Priority Data

May 13, 2004    (EP) .................................. 04300277

(51) Int. Cl.
  *H04B 1/26* (2006.01)
(52) U.S. Cl. ........................ 455/323; 455/326; 455/338; 455/340
(58) Field of Classification Search ................ 455/313, 455/323, 326, 338, 340
See application file for complete search history.

(56) References Cited

U.S. PATENT DOCUMENTS

| | | | | |
|---|---|---|---|---|
| 3,727,078 A | * | 4/1973 | Wollesen | .................... 327/113 |
| 5,270,824 A | * | 12/1993 | Dobrovolny | ................. 348/731 |
| 5,548,840 A | * | 8/1996 | Heck | .......................... 455/326 |
| 6,009,318 A | * | 12/1999 | Freed | ......................... 455/326 |
| 6,140,849 A | * | 10/2000 | Trask | ......................... 327/113 |
| 6,316,996 B1 | * | 11/2001 | Puotiniemi | .................. 330/254 |
| 6,650,883 B1 | * | 11/2003 | Stephane et al. | ............ 455/313 |
| 6,959,178 B2 | * | 10/2005 | Macedo et al. | .............. 455/313 |
| 7,031,687 B2 | * | 4/2006 | Kivekas et al. | .............. 455/313 |
| 7,106,095 B2 | * | 9/2006 | Kim et al. | ...................... 326/30 |
| 7,236,761 B2 | * | 6/2007 | Kivekas et al. | .............. 455/313 |
| 7,421,263 B2 | * | 9/2008 | Kim | ........................ 455/234.1 |

FOREIGN PATENT DOCUMENTS

WO    WO 02/084859    10/2002

* cited by examiner

*Primary Examiner*—Duc M Nguyen
(74) *Attorney, Agent, or Firm*—Peter J. Meza; William J. Kubida; Hogan & Hartson LLP

(57) ABSTRACT

A calibration device (CC) is coupled to a balanced circuit device (MC) comprising first and second outputs respectively provided with first (Z1) and second (Z2) load impedance means. This calibration device (CC) comprises adjusting means (ADM) arranged to adjust said first (Z1) and second (Z2) load impedance means into a load imbalance for linearization purposes, and a coupling means (CM) inserted between the load impedance adjusting means (ADM) and the first and second outputs and arranged to selectively couple the load impedance adjusting means (ADM) to only a chosen one of the first and second outputs, so that the load impedance adjusting means (ADM) is connected in parallel either to the first load impedance means (Z1) or to the second load impedance means (Z2).

17 Claims, 2 Drawing Sheets

BALANCED MIXER WITH CALIBRATION OF LOAD IMPEDANCES

FIELD OF THE INVENTION

The present invention relates to balanced circuit devices and more precisely to calibration devices coupled to such balanced circuit devices for the purpose of linearization.

BACKGROUND OF INVENTION

Certain pieces of radio equipment, such as certain radio conversion receivers and/or transmitters, are provided with balanced circuit devices, such as mixers or amplifier circuits.

Due to their layouts the balanced circuit devices, and notably those used in direct or low-intermediate frequency (IF) conversion receivers, present dissymmetry and imbalance. As it is known by one skilled in the art, the presence of such dissynmmetry and imbalance increases even-order non-linearities. Due to these even-order non-linearities, a higher even-order intermodulation appears: two strong interferers that are close to the frequency channel of interest, generate a low-frequency distortion. With this low-frequency distortion appearing in the low-frequency band where the demodulated wanted signal stands, it is difficult to separate the wanted signal from the (unwanted) distortion.

For rejecting this high even-order intermodulation, the balanced circuit devices must be coupled to a dedicated device allowing the achievement of a high second-order input intercept point (or IIP2).

An example of such a dedicated device is notably described in the patent document WO 02/084859. More precisely, this patent document describes the use of one or two "IIP2 calibration devices" that aim at adjusting first and second load impedance means, respectively coupled to first and second outputs of a balanced circuit device, to a load imbalance for linearization purpose. Each (IIP2) calibration device comprises switched resistors connected in parallel and tuned so that a proper imbalance of the first and second load impedance means balances the balanced circuit device.

The imbalance introduced in the balanced circuit device is small so that it has a negligible effect on its other performance parameters such as the gain, the noise or the third order input intercept point (or IIP3). But, the dissymmetry and imbalance of the balanced circuit device being generally very small, switched resistors of high value need to be connected in parallel to compensate the introduced imbalance. So when each balanced circuit device output is provided with its own (IIP2) calibration device, the area occupied by these two (IIP2) calibration devices is too large. And when only one of the two balanced circuit device outputs is provided with a (IIP2) calibration device, its dissymmetry and imbalance cannot be properly compensated. More precisely, this allows only to compensate the dissymmetry in a single way, because adding resistor(s) to a load always lowers this load.

So, the object of this invention is to improve the situation.

SUMMARY OF THE INVENTION

For this purpose, it provides a (IIP2) calibration device comprising means for adjusting the first and second load impedance means, which are respectively provided on the first and second outputs of a balanced circuit device, into a load imbalance for the purpose of linearization.

This (IIP2) calibration device is characterized in that it also comprises a coupling means inserted between the load impedance adjusting means and the first and second outputs and arranged to selectively couple this load impedance adjusting means to only a chosen one of the first and second outputs. Thus, the load impedance adjusting means may be connected in parallel either to the first load impedance means or to the second load impedance means.

The (IIP2) calibration device according to the invention may include additional characteristics considered separately or combined, and notably:
  the coupling means may comprise at least a first switching means inserted between the load impedance adjusting means and the first output and a second switching means inserted between the load impedance adjusting means and the second output, said first and second switching means being arranged to couple the load impedance adjusting means to only one of the first and second outputs at the same time,
  the coupling means may comprise a third switching means comprising a first terminal coupled to the first output upstream of (or downstream of) the first switching means and a fourth switching means comprising a first terminal coupled to the second output upstream of (or downstream of the second switching means, the third switching means being arranged to be in an "off" (respectively "on") state when the first switching means is in an on (respectively "off") state, and the fourth switching means being arranged to be in an "off" (respectively "on") state when the second switching means is in an "on" (respectively "off") state. Thus each of the first and second outputs is always coupled to one switching means in its "on" state and one switching means in its "off" state,
  the third and fourth switching means may be dummy switching means each comprising a second terminal, said second terminals being coupled to each other,
  the states of the first, second, third and fourth switching means may be controlled by the same command signal,
  the load impedance adjusting means may comprise at least one adjusting element comprising a control switch means connected in series to an auxiliary load impedance means (a resistor for instance),
  the load impedance adjusting means may comprise at least two adjusting elements connected in parallel, each of these adjusting elements being selectable through command signals to adjust the first or second load impedance means to a chosen load imbalance,
  each auxiliary load impedance means may comprise one terminal coupled to the first and second switching means,
  each of the auxiliary load impedance means may differ from one adjusting element to another.

The invention also provides a balanced circuit device comprising first and second outputs respectively provided with first and second load impedance means, and a (IIP2) calibration device such as the one introduced above, coupled to these first and second outputs. Such a balanced circuit device may be a mixer circuit (possibly in the form of a Gilbert-cell multiplier), or a modulator circuit or else a demodulator circuit, for instance.

The invention also provides a receiver and/or transmitter device comprising at least one balanced circuit device such as the one introduced above. Such a receiver and/or transmitter device may comprise a direct conversion receiver circuit or a low-intermediate frequency conversion receiver circuit.

The invention also provides an integrated circuit defining at least one balanced circuit device such as the one introduced above, or defining a receiver and/or transmitter circuit comprising at least one balanced circuit device such as the one introduced above.

BRIEF DESCRIPTION OF THE DRAWINGS

Other features and advantages of the invention will become apparent on examining the detailed specifications hereafter and the appended drawings, wherein.

The appended drawings may not only serve to complete the invention, but also to contribute to its definition, if need be.

DETAILED DESCRIPTION OF PREFERRED EMBODIMENTS

Figure 1:
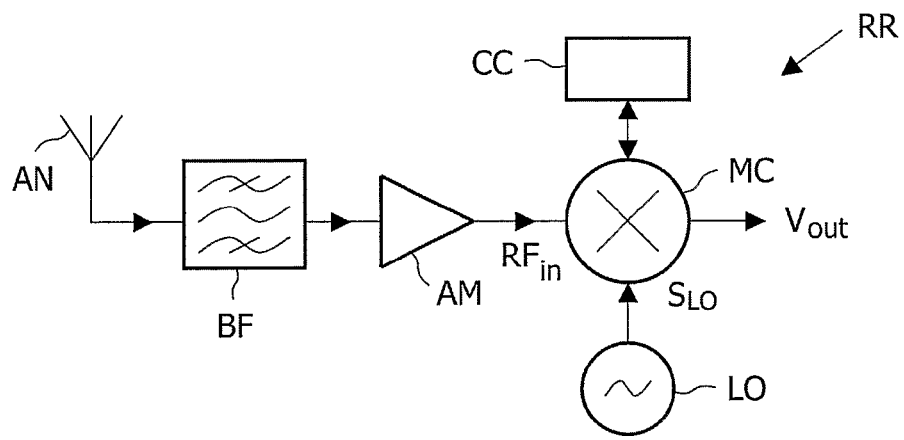
FIG. 1 schematically illustrates an example of a radio receiver in which the invention may be applied, FIG. 2 schematically illustrates an example of a balanced circuit device forming a mixer circuit and comprising a first example of embodiment of an (IIP2) calibration device according to the invention, FIG. 3 schematically illustrates an example of embodiment of a load impedance adjusting block that may form part of a (IIP2) calibration device according to the invention, and FIG. 4 schematically illustrates another example of a balanced circuit device forming a mixer circuit and comprising a second example of embodiment of an (IIP2) calibration device according to the invention.

Reference is initially made to FIG. 1 to describe an example of radio receiver RR in which the invention may be applied It is important to notice that the invention is not limited to this type of radio equipment. Indeed it may also be applied to other types of radio equipment such as transmitter devices or receiver and transmitter devices.

In the following description it will be considered that the illustrated radio receiver RR is a direct conversion receiver, which may be used in a base station such as a Node B of a UMTS communication network. But it may also be a low-intermediate frequency (IF) conversion receiver.

The illustrated radio receiver RR comprises schematically an antenna AN adapted to receive radio signals, a bandpass filter BF fed by the antenna AN, an amplifier AM fed by the bandpass filter BF, a balanced circuit device comprising for instance a mixer circuit MC comprising a first input fed with filtered and amplified signals $RF_{in}$ by the amplifier AM and a second input fed with a local signal $S_{LO}$ (here at a zero frequency) by a local oscillator LO, and an IIP2 calibration circuit (or device) CC coupled to the mixer circuit MC and which will be discussed in detail later on.

The mixer circuit MC is arranged to mix $RF_{in}$ with $S_{LO}$ to deliver an output voltage $V_{out}$ ($V_{out}=V_{out+}-V_{out-}$) at a zero frequency on first and second outputs (which are merged in FIG. 1).

Figure 2:
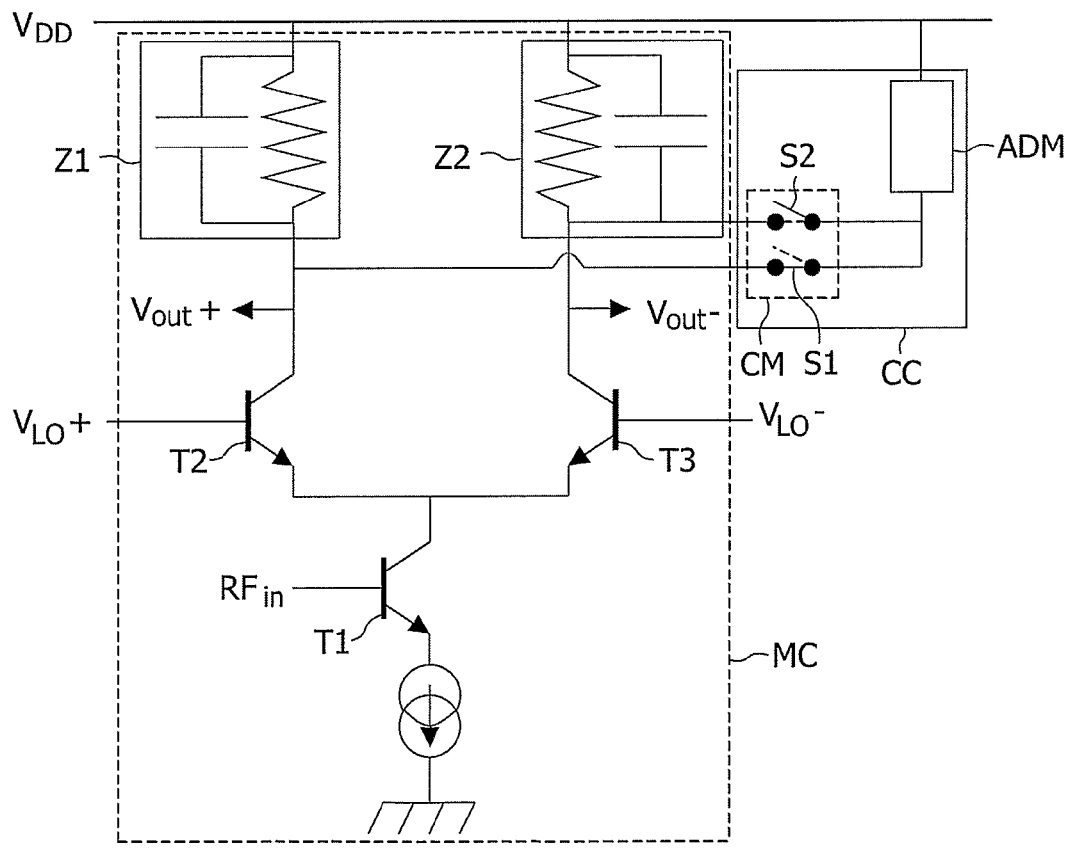

An example of mixer circuit MC is illustrated in FIG. 2. More precisely the illustrated mixer circuit MC is called a Gilbert-cell circuit by a person skilled in the art. Such a circuit is usually used as a balanced circuit device in mixer circuits, but also in an amplifier circuit and a multiplier circuit. Therefore the (IIP2) calibration circuit CC according to the invention may also be applied to an amplifier circuit and a multiplier circuit. It may also be applied to a modulator circuit or else a demodulator circuit, for instance.

The mixer circuit MC comprises a first input fed with the filtered and amplified signals $RF_{in}$ and feeding the base terminal of a first transistor T1, a second input fed with the local oscillator signal $S_{LO}$ and feeding the base terminal $V_{LO+}$ of a second transistor T2 and the base terminal $V_{LO-}$ of a third transistor T3.

The emitter terminal of the second transistor T2 is connected to the emitter terminal of the third transistor T3 and to the collector terminal of the first transistor T1. The collector terminal of the second transistor T2 is connected to a first output line of the mixer circuit MC, to which is coupled the first output $V_{out+}$, while the collector terminal of the third transistor T3 is connected to a second output line of the mixer circuit MC, to which is coupled the second output $V_{out-}$.

The first output line is connected to a positive operating voltage $V_{DD}$ through a first load impedance Z1 while the second output line is also connected to the positive operating voltage $V_{DD}$ but through a second load impedance Z2. For instance, and as illustrated, the first Z1 and second Z2 load impedance comprise a capacitor and a resistor connected in parallel. But any kind of load impedance means may be used.

The (IIP2) calibration circuit CC according to the invention comprises one adjusting module ADM allowing the achievement of a high second-order input intercept point (or IIP2) in the mixer circuit MC. More precisely, the calibration circuit CC is arranged to adjust the first Z1 or second Z2 load impedance of the mixer circuit MC to compensate or introduce a chosen load imbalance.

The (IIP2) calibration circuit CC also comprises a coupling module CM inserted between a first terminal of the adjusting module ADM and the first $V_{out+}$ and second $V_{out-}$ outputs of the mixer circuit MC and arranged to selectively couple the adjusting module ADM to only a chosen one of these first $V_{out+}$ and second $V_{out-}$ outputs as a function of a command signal.

The second terminal of the adjusting module ADM, opposite the first one, being connected to the positive operating voltage $V_{DD}$, and therefore to one terminal of the first Z1 and second Z2 load impedances, the adjusting module ADM may be selectively connected in parallel either to the first load impedance Z1 or to the second load impedance Z2.

Figure 3:
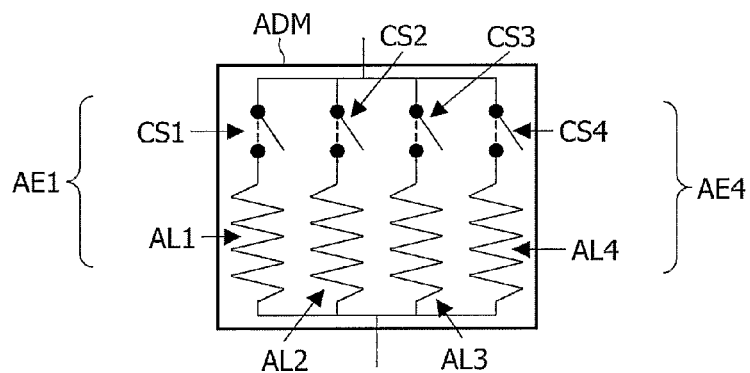

A non-limiting example of embodiment of an adjusting module ADM is illustrated in FIG. 3. In this example the adjusting module ADM comprises several (4) adjusting elements AEi (I=1 to 4) connected in parallel and each comprising a control switch means CSi connected in series to an auxiliary load impedance means ALi.

For instance the control switch means CSi may be a switch, which can be monitored by a command signal through a terminal (not illustrated) to be either in an "on" state or an "off" state. Preferably all of the control switch means CSi are the same.

Each auxiliary load impedance means ALi may be a resistor, for instance. The load impedance value LIi of the different auxiliary load impedance means ALi may all be the same. But they may also be different. For instance the different auxiliary load impedance means ALi may be arranged to provide weighted loads. For example, their load impedance values LIi may be defined by the following law:

$$LIi = 2^{(i-1)} \cdot k \cdot LI$$

wherein k is an integer depending on the desired tuning range and LI is a unitary load impedance value. For instance the desired tuning range is equal to ±5% of the unitary load impedance value LI and the resolution of the load impedance adjustment is equal to 0.2% or 0.1%.

By selecting the command signal (and therefore the state) of each control switch means Csi, one can precisely define the adjustment load impedance value of the adjusting module ADM which is connected in parallel via the coupling module CM either to the first load impedance Z1 or to the second load impedance Z2, in order to finely tune its value and so to compensate the imbalance and dissymmetry of the mixer circuit MC.

A lot of alternative embodiments of the adjusting module ADM may be envisaged. In a first alternative the adjusting module ADM may comprise a single adjusting element AE or at least two adjusting elements AE connected in parallel, of the type described above. In another alternative the adjusting module ADM may comprise a single adjusting element comprising several resistors connected in series and each able to be shunted as in a DAC of the R2R type.

In the example of embodiment illustrated in FIG. 2 the coupling module CM comprises a first switching means S1, inserted between the first terminal of the adjusting module ADM and the first output $V_{out+}$, and a second switching means S2, inserted between the first terminal of the adjusting module ADM and the second output $V_{out-}$. So, according to the chosen command signal either the first switching means S1 couples the first terminal of the adjusting module ADM to the first output $V_{out+}$ while at the same time the second switching means S2 does not couple said first terminal of the adjusting module ADM to the second output $V_{out-}$, or the first switching means S1 does not couple the first terminal of the adjusting module ADM to the first output $V_{out+}$ while at the same time the second switching means S2 couples said first terminal of the adjusting module ADM to the second output $V_{out-}$.

For instance the first S1 and second S2 switching means are identical switches that can take two different states: an "on" state allowing coupling and one state "off" prohibiting coupling. In that case when one switch is "on" the other is "off".

The first S1 and second S2 switches may be N-MOS and P-MOS components respectively whose states may be monitored by an initial command signal and the opposite of this initial command signal obtained with an inverter.

A lot of alternative embodiments of the coupling module CM may be envisaged. One of them will now be described with reference to FIG. 4.

Figure 4:
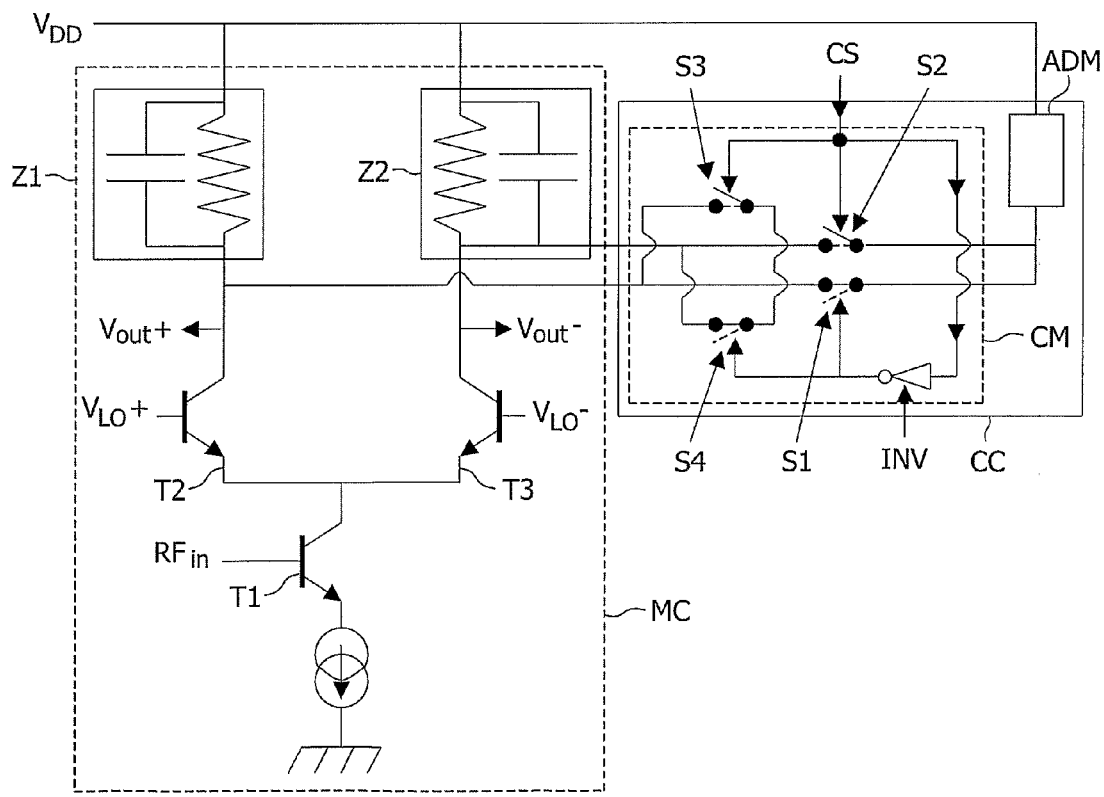

The coupling module CM illustrated in FIG. 4 aims at improving the embodiment illustrated in FIG. 2. Indeed in the coupling module CM illustrated in FIG. 2 there is always one mixer circuit output directly coupled to the adjusting module ADM through a switch in its "on" state, while the other mixer circuit output is only coupled to a switch in its "off" state, which may introduce a dissymmetry and lower the IIP2.

To overcome this drawback the coupling module CM comprises not only the first S1 and second S2 switching means described above (with reference to FIG. 2) but also third S3 and fourth S4 switching means with "on" and "off" states.

As illustrated the third switching means S3 comprises a first terminal coupled to the first output $V_{out+}$ upstream of the first switching means S1 (i.e. between S1 and $V_{out+}$) and the fourth switching means S4 comprises a first terminal coupled to the second output $V_{out-}$ upstream of the second switching means S2 (i.e. between S2 and $V_{out-}$). Moreover, the third switching means S3 is arranged to be in an "off" state ("on" state respectively) when the first switching means S1 is in an "on" state ("off" state respectively), and the fourth switching means S4 is arranged to be in an "off" state ("on" state respectively) when the second switching means S2 is in an "on" state ("off" state respectively).

With such an arrangement the first $V_{out+}$ and second $V_{out-}$ outputs are always coupled at the same time to one switching means in its "on" state and one switching means in its "off" state.

So, if the first S1, second S2, third S3 and fourth S4 switching means are identical, the combined load impedance influence of the first S1 and third S3 switching means on the first output $V_{out+}$ is identical with the combined load impedance influence of the second S2 and fourth S4 switching means on the second output $V_{out-}$. In other words the symmetry is preserved.

As illustrated in FIG. 3 the third S3 and fourth S4 switching means are preferably dummy switching means, i.e. switching means that are not used to couple the adjusting module ADM to the first Z1 or second Z2 load impedance.

Preferably, and as illustrated, the second terminals of the third S3 and fourth S4 switching means are coupled to each other.

Moreover, and as illustrated, one can use a single command signal for monitoring the respective states of the first S1, second S2, third S3 and fourth S4 switching means. For this purpose the states of the second S2 and third S3 switching means (that must always be the same at the same time) may be monitored by an initial command signal ("0" or "1") while the states of the first S1 and fourth S4 switching means (that must always be the same at the same time) may be monitored by the opposite of this initial command signal ("1" or "0") generated with an inverter INV.

For instance the first S1 and fourth S4 switching means may be P-MOS and the second S2 and third S3 switching means may be N-MOS components whose states are monitored by the command signal and its opposite.

On the one hand, when the (IIP2) calibration circuit CC and the first load impedance Z1 must be connected in parallel, the first S1 and fourth S4 switching means are placed in their "on" state (represented by the straight lines) while the second S2 and third S3 switching means are placed in their "off" state (also represented by the straight lines). On the other hand, when the (IIP2) calibration circuit CC and the second load impedance Z2 must be connected in parallel, the first S8 and fourth S4 switching means are placed in their "off" state (represented by the dotted lines) while the second S2 and third S3 switching means are placed in their "on" state (also represented by the dotted lines).

The balanced circuit device MC according to the invention may be realized in an integrated circuit form, or it may constitute a part of an integrated circuit. For instance this integrated circuit may be part of, or may constitute, a zero IF receiver and/or transmitter integrated circuit, notably for wireless CDMA equipment, such as a mobile (or cellular) phone.

Such an integrated circuit may be realized in bipolar or C-MOS technology.

The invention is not limited to the examples of embodiments of (IIP2) calibration device (or circuit), balanced circuit device and receiver and/or transmitter device described above, but it encompasses all alternative embodiments which may be considered by one skilled in the art to be within the scope of the following claims.

The invention claimed is:

1. Calibration device for a balanced circuit device comprising first and second outputs respectively provided with first and second load impedance means, said calibration device comprising adjusting means arranged to adjust said first and second load impedance means into a load imbalance for the purpose of linearization, characterized in that it comprises a coupling means inserted between said load impedance adjusting means and said first and second outputs and arranged to selectively couple said load impedance adjusting means to only a chosen one of said first and second outputs, so that said load impedance adjusting means is connected in parallel either to said first load impedance means or to said second load impedance means.

2. Calibration device according to claim 1, characterized in that said coupling means comprises at least a first switching means inserted between said load impedance adjusting means and said first output and a second switching means inserted between said load impedance adjusting means and said second output, said first and second switching means being arranged to couple said load impedance adjusting means to only one of said first and second outputs at the same time.

3. Calibration device according to claim 2, characterized in that said coupling means also comprises a third switching means comprising a first terminal coupled to said first output upstream of said first switching means and a fourth switching means comprising a first terminal coupled to said second output upstream of said second switching means said third switching means being arranged to be in an "off" state when said first switching means is in an "on" state, and said fourth switching means being arranged to be in an "off" state when said second switching means is in an "on" state, whereby each of said first and second outputs is always coupled to one switching means in its "on" state and one switching means in its "off" state.

4. Calibration device according to claim 3, wherein said third and fourth switching means are dummy switching means each comprising a second terminal, said second terminals being coupled to each other.

5. Calibration device according to claim 3, wherein said states of said first second third and fourth switching means are controlled by the same command signal.

6. Calibration device according to claim 1, wherein said load impedance adjusting means comprises at least one adjusting element comprising a control switch means connected in series to an auxiliary load impedance means.

7. Calibration device according to claim 6, wherein said load impedance adjusting means comprises at least two adjusting elements connected in parallel, each of said adjusting elements being selectable through command signals to adjust said first or second load impedance means to a chosen load imbalance.

8. Calibration device according to claim 6, wherein each auxiliary load impedance means comprises one terminal coupled to said first and second switching means.

9. Calibration device according to claim 6, wherein each of said auxiliary load impedance means differs from one adjusting element to another.

10. Balanced circuit device comprising first and second outputs respectively provided with first and second load impedance means, characterized in that it comprises a calibration device according to any one of the preceding claims, coupled to said first and second outputs.

11. Balanced circuit device according to claim 10, characterized in that it is chosen in a group comprising a mixer circuit, a modulator circuit and a demodulator circuit.

12. Balanced circuit device according to claim 11, characterized in that it constitutes a mixer circuit arranged in the form of a Gilbert-cell multiplier.

13. Receiver and/or transmitter device characterized in that it comprises at least one balanced circuit device according to claim 10.

14. Receiver and/or transmitter device according to claim 13, characterized in that it comprises a direct conversion receiver circuit.

15. Receiver and/or transmitter device according to claim 13, characterized in that it comprises a low-intermediate frequency conversion receiver circuit.

16. Integrated circuit, characterized in that it defines at least one balanced circuit device according to claim 10.

17. Integrated circuit, characterized in that it defines a receiver and/or transmitter circuit comprising at least one balanced circuit device according to claim 10.

* * * * *

UNITED STATES PATENT AND TRADEMARK OFFICE
CERTIFICATE OF CORRECTION

| | | |
|---|---|---|
| PATENT NO. | : 7,587,192 B2 | Page 1 of 1 |
| APPLICATION NO. | : 11/579884 | |
| DATED | : September 8, 2009 | |
| INVENTOR(S) | : Philippe Barre | |

It is certified that error appears in the above-identified patent and that said Letters Patent is hereby corrected as shown below:

On the Title Page

Item (87) PCT Pub. No.:

"WO02/084859" should be --WO2005/112251 A1--

PCT Pub. Date:

"Oct. 24, 2002" should be --Nov. 24, 2005--

Column 7, line 30, after "first" should be --,--

Column 7, line 30, after "second" should be --,--

Signed and Sealed this

Second Day of March, 2010

David J. Kappos
*Director of the United States Patent and Trademark Office*